United States Patent
Song et al.

(10) Patent No.: US 7,518,670 B2
(45) Date of Patent: Apr. 14, 2009

(54) HEAT CONDUCTION MEMBER AND LIQUID CRYSTAL DISPLAY HAVING THE SAME

(75) Inventors: Chun-ho Song, Seoul (KR); Seock-hwan Kang, Suwon-si (KR); Gi-cherl Kim, Yongin-si (KR); Sang-yu Lee, Yongin-si (KR); Joo-woan Cho, Seoul (KR)

(73) Assignee: Samsung Electronics Co., Ltd., Suwon-Si ( * ) Notice: Subject to any disclaimer, the term of this patent is extended or adjusted under 35 U.S.C. 154(b) by 430 days.

(21) Appl. No.: 11/359,967

(22) Filed: Feb. 22, 2006

(65) Prior Publication Data
US 2006/0232937 A1  Oct. 19, 2006

(30) Foreign Application Priority Data
Apr. 15, 2005 (KR) .................. 10-2005-0031347

(51) Int. Cl.
*G02F 1/1333* (2006.01)
*H05K 7/20* (2006.01)

(52) U.S. Cl. ........................................ 349/58; 361/704
(58) Field of Classification Search ................... 349/56, 349/58; 361/681, 704
See application file for complete search history.

(56) References Cited

U.S. PATENT DOCUMENTS

2006/0077314 A1* 4/2006 Li et al. .................... 349/58
2007/0132127 A1* 6/2007 Fukushima ............. 264/29.1

* cited by examiner

Primary Examiner—Frank G Font
Assistant Examiner—Michael P Mooney
(74) Attorney, Agent, or Firm—F. Chau & Associates, LLC

(57) ABSTRACT

An LCD comprises an LCD panel on which an image is formed, a light guiding plate disposed behind the LCD panel, an LED unit disposed along at least one side of the light guiding plate and providing light to the LCD panel, a bottom chassis accommodating the light guiding plate and the LED unit, and a heat conduction member disposed across an external surface of the bottom chassis from an area facing the LED unit to an area apart from the LED unit and having a higher thermal conductivity than the bottom chassis.

19 Claims, 7 Drawing Sheets

US 7,518,670 B2

HEAT CONDUCTION MEMBER AND LIQUID CRYSTAL DISPLAY HAVING THE SAME

CROSS-REFERENCE TO RELATED APPLICATION

This application claims the benefit of Korean Patent Application No. 2005-0031347, filed on Apr. 15, 2005, the disclosure of which is incorporated herein by reference in its entirety.

BACKGROUND OF THE INVENTION

1. Technical Field

The present disclosure relates to a heat conduction member and a liquid crystal display (LCD) having the same, and more particularly, to a lightweight heat conduction member and a corresponding LCD having the same, which exhibit improved cooling efficiency.

2. Discussion of the Related Art

A liquid crystal display (LCD) comprises an LCD panel having a thin-film transistor (TFT) substrate, a color filter substrate and a liquid crystal layer disposed therebetween. The LCD panel does not emit light by itself. Therefore, a backlight unit may be disposed behind the TFT substrate for providing light. The transmittance of the light from the backlight unit depends on an alignment of liquid crystal molecules within the liquid crystal layer. The LCD panel and the backlight unit are accommodated within a chassis.

The backlight unit is classified into an edge type backlight unit or a direct type backlight unit according to where a light source is disposed in the backlight unit.

The edge type backlight unit is employed in a small-sized LCD, such as, a monitor of laptop and desktop computers or a portable terminal apparatus. The edge type backlight unit comprises a light guiding plate disposed behind the LCD panel, and a reflecting sheet disposed behind the light guiding plate. The edge type backlight unit also includes a lamp unit disposed along at least one side of the light guiding plate, the lamp unit providing light to the LCD panel. Optical sheets, which diffuse and focus the light guided by the light guiding plate, are disposed on the light guiding plate.

An Electro Luminescence (EL) device, a Cold Cathode Fluorescent Lamp (CCFL), a Hot Cathode Fluorescent Lamp (HCFL), an External Electrode Fluorescent Lamp (EEFL), or an Light Emitting Diode (LED) may be used as a lamp unit.

Light emitted from the lamp unit is transformed to a surface light source by the light guiding plate and may be incident upon the LCD panel.

An LED light source generates more heat than other light sources (e.g., CCFL and EEFL). The heat from the LED causes brightness to decrease and a color shift to generate.

A radiating fin, a heat pipe and a cooling fan are used to remove the heat from the LED, but also cause the LCD to be weighty and thick.

SUMMARY OF THE INVENTION

Embodiments of the present invention provide a heat conduction member and an LCD having the same that is light and slim and exhibit improved cooling efficiency.

An LCD, in accordance with an embodiment of the present invention, comprises an LCD panel on which an image is formed, a light guiding plate disposed behind the LCD panel, an LED unit disposed along at least one side of the light guiding plate and providing light to the LCD panel, a bottom chassis accommodating the light guiding plate and the LED unit, and a heat conduction member disposed across an external surface of the bottom chassis from an area facing the LED unit to an area spaced apart from the LED unit, the heat conduction member having a higher thermal conductivity than the bottom chassis.

A thermal conductivity of the heat conduction member may be at least about 90 W/mK higher than that of the bottom chassis.

The thermal conductivity of the heat conduction member may be about 220 W/mK or more.

A thermal conductivity of the bottom chassis may be about 130 W/mK or less.

The bottom chassis may be formed in a quadrangular shape and comprise a bottom side and lateral sides formed by bending upwardly each edge of the bottom side. The heat conduction member may comprise a first conducting part combined with the lateral sides and a second conducting part combined with the bottom side.

LED units may be disposed at opposite edges of the light guiding plate, and the first conducting part may include a first portion and a second portion respectively disposed corresponding to the LED units at the opposite edges.

The second conducting part may comprise a rectilinear area and an oblique area disposed in an oblique direction from the rectilinear area.

The first conducting part, including the first and second portions, may be thicker than the second conducting part.

The heat conduction member may be made by using a mold.

The heat conduction member may be applied to an entire rear surface of the bottom chassis.

The heat conduction member may further comprise an adhesive layer disposed on the bottom chassis.

The heat conduction member may comprise graphite.

According to an embodiment of the present invention, a heat conduction member for a liquid crystal display comprises a first conducting part and a second conducting part extended from the first conducting part, wherein thermal conductivity of the heat conduction member is about 220 W/mK or more.

The first conducting part and the second conducting part may be in a plate shape and combined in a single body to form a 'U' shape.

BRIEF DESCRIPTION OF THE DRAWINGS

Preferred embodiments of the present invention can be understood in more detail from the following descriptions taken in conjunction with the accompanying drawings of which.

DETAILED DESCRIPTION OF THE PREFERRED EMBODIMENTS

Figure 1:
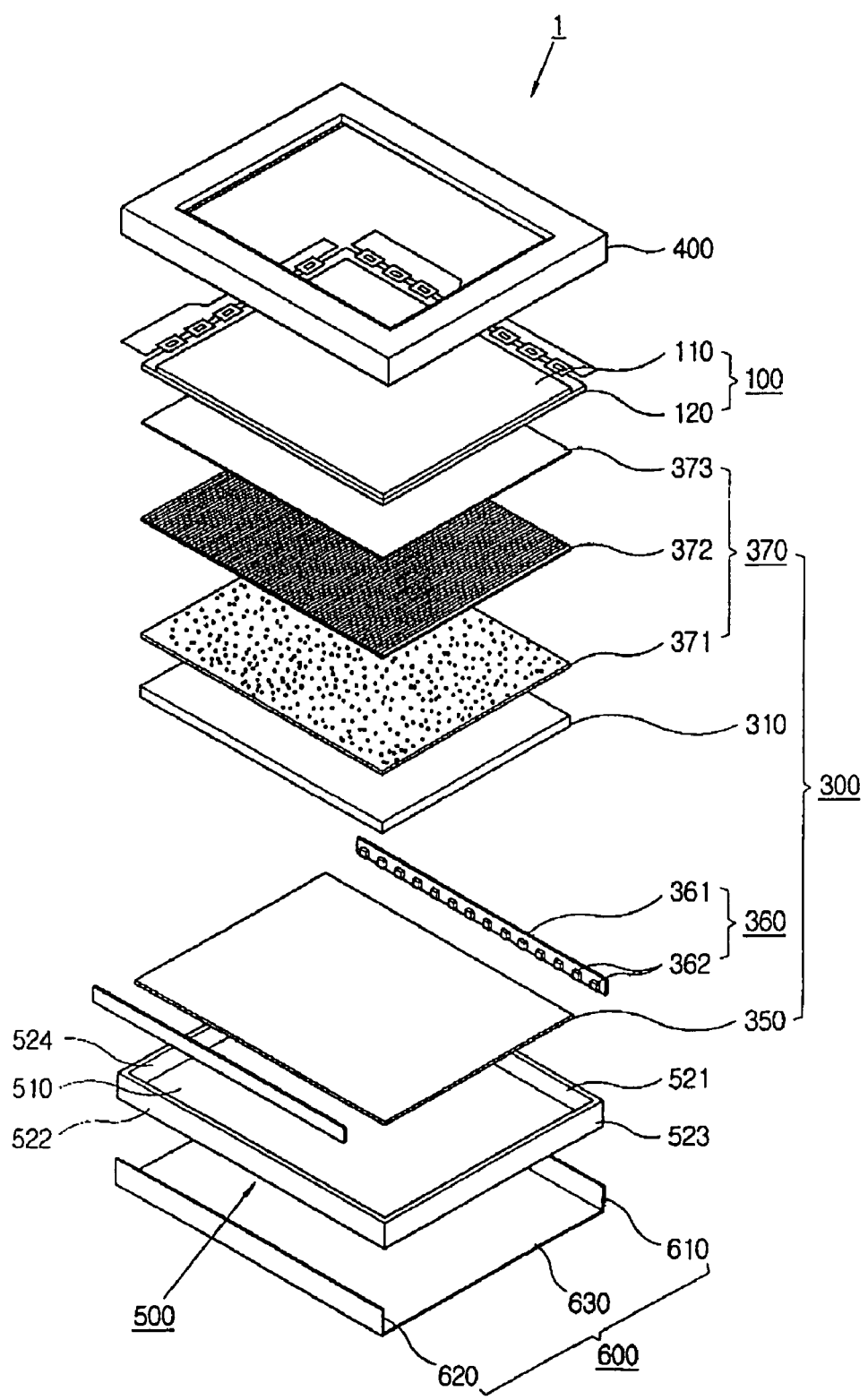
FIG. 1 is a perspective view of an LCD comprising a heat conduction member according to an embodiment of the present invention.
Figure 2:
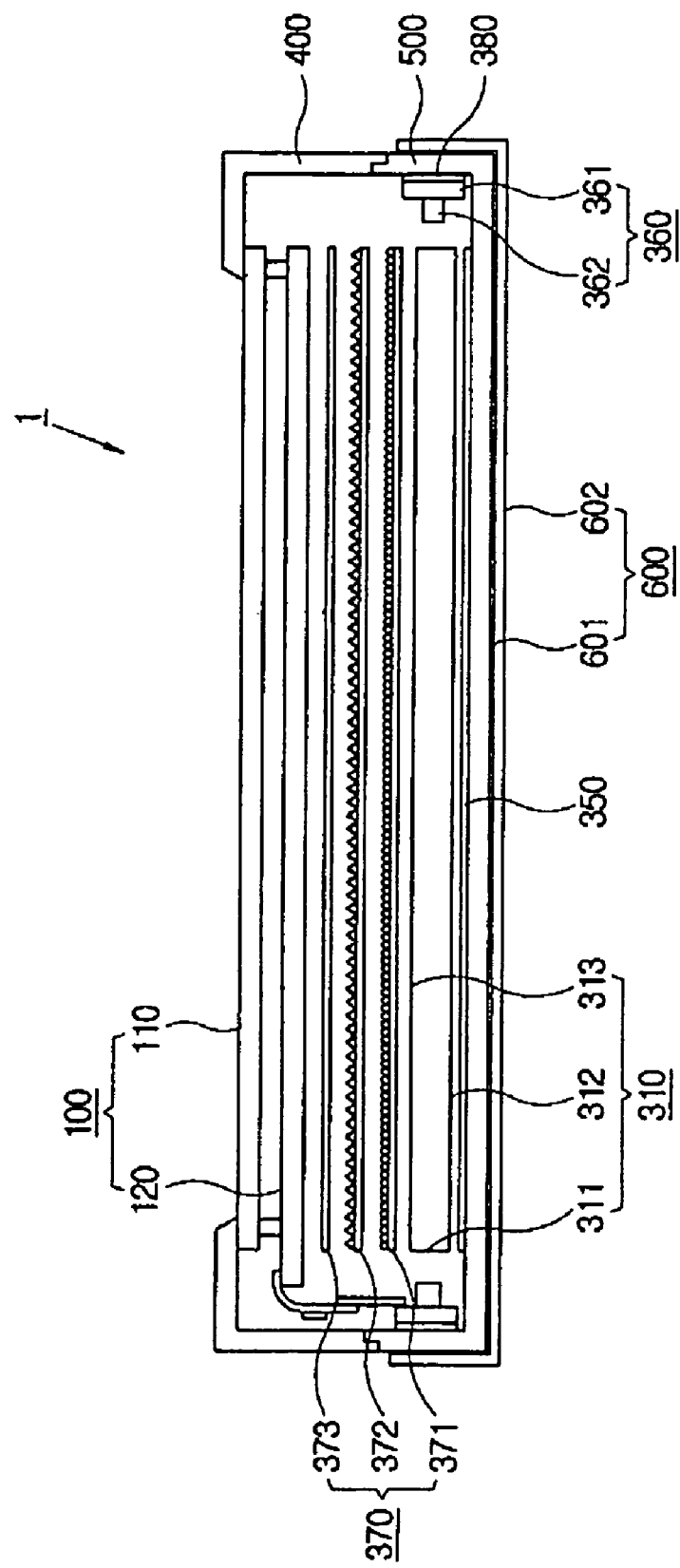
FIG. 2 is a sectional view of the LCD shown in FIG. 1.

Preferred embodiments of the present invention will now be described more fully hereinafter below in more detail with reference to the accompanying drawings, in which preferred embodiments of the invention are shown. This invention may, however, be embodied in different forms and should not be construed as limited to the embodiments set forth herein.

As shown in FIG. 1 to FIG. 4, an LCD 1 according to a an embodiment of the present invention comprises an LCD panel 100 on which an image is formed, a backlight unit 300 disposed behind the LCD panel 100, and a top chassis 400 and a bottom chassis 500 disposed on the LCD panel 100 and behind the back light unit 300, respectively. The top and bottom chassis 400, 500 accommodate the LCD panel 100 and the back light unit 300. The backlight unit 300 provides light to the LCD panel 100. A heat conduction member 600 is disposed on an external surface of the bottom chassis 500.

The LCD panel 100 comprises a TFT substrate 110, a color filter substrate 120 and a liquid crystal layer (not shown) disposed therebetween.

The backlight unit 300 comprises a light guiding plate 310 disposed behind the LCD panel 100, and a reflecting sheet 350 disposed behind the light guiding plate 310. The reflecting sheet 350 reflects light, which is leaked in the opposite direction of the LCD panel 100, to the light guiding plate 310. The backlight unit 300 also comprises an LED unit 360 disposed along at least one side of the light guiding plate 310. The LED unit provides light to the LCD panel 100. The backlight unit 300 also includes optical sheets 370 disposed on the light guiding plate 310. The optical sheets 370 diffuse and focus light guided by the light guiding plate 310.

The light guiding plate 310 has a square-plate shape and comprises an incident surface 311 on which light emitted from the LED unit 360 is incident, a reflective surface 312 forming a predetermined angle with the incident surface 311 and facing the reflecting sheet 350, and an exiting surface 313 facing the LCD panel 100 and emitting light to the LCD panel 100.

A pair of LED units 360 are disposed parallel with each other adjacent sides of opposite incident surfaces 311 of the light guiding plate 310. The LED units 360 comprise a plurality of LED members 362 and a substrate 361 supplying an electric signal to the plurality of LED members 362.

Each LED member 362 has a quadrangular shape and comprises red, green, and blue chips and a light guiding part having silicon inside, which emits white light toward the light guiding plate 310.

A gap pad 380 is disposed between a substrate 361 and lateral sides 521, 522 of the bottom chassis 500. The gap pad 380 is a thin plate having a high thermal conductivity and is about 0.5 mm thick. Since the substrate 361 and the bottom chassis 500 are adhered to each other via the gap pad 380, heat generated from the LED unit 360 is easily conducted to the chassis 500.

Each LED member 362 may emit red, green and blue colors separately so that light from each LED member 362 may be mixed to be incident to the light guiding plate 310.

Optical sheets 370 comprise a diffusion film 371 having a coating layer in the form of beads, a prism film 372 disposed on the diffusion film 371, and a protection film 373 disposed between the LCD panel 100 and the prism film 372. The diffusion film 371 diffuses light from the light guiding plate 310. The prism film 372 focuses light in the perpendicular direction to the LCD panel 100. The protection film 373 protects the LCD panel 100.

Two or three diffusion films 371 may be overlapped.

Typically, two prism films 372, a regular prism and an inverse prism, are used, and micro prisms formed on each prism film make predetermined angles with respect to each other. Accordingly, light incident from the diffusion film 371 progresses vertically on the LCD panel 100, thereby forming a uniform brightness distribution.

The bottom chassis 500 is formed in a quadrangular shape and comprises a bottom side 510 and lateral sides 521, 522, 523, 524 formed by bending upwardly each edge of the bottom side 510. The bottom chassis 500 is joined to the top chassis 400 and the backlight unit 300 is accommodated therebetween. On the external surface of the bottom chassis 500 is disposed the heat conduction member 600 to radiate heat generated from the LED unit 360 accommodated in the bottom chassis 500. The bottom chassis 500 may be made of aluminum and thermal conductivity of aluminum is approximately 130 W/mK.

The heat conduction member 600 is disposed on the external surface of the bottom chassis 500 from an area facing the LED unit 360 to an area spaced apart from the LED unit 360. According to an embodiment of the present invention, the difference of heat conductivity between the heat conduction member 600 and the bottom chassis 500 is about 90 W/mK or more. Accordingly, heat conducted to the bottom chassis 500 from the LED unit 360 may be quickly exchanged with outside air by the heat conduction member 600. Thermal conductivity of the heat conduction member 600 is preferably about 220 W/mK or more. In an embodiment of the present invention, thermal conductivity of the bottom chassis 500 is preferably about 130 W/mK or less.

The heat conduction member 600 may comprise graphite, thereby cost or weight may be decreased as compared with a heat conduction member that uses a metal substance like copper (Cu).

The heat conduction member 600 in an embodiment of the present invention is a film type and comprises a heat conducting part 602 and an adhesive layer 601 facing the bottom chassis 500. Since the heat conduction member 600 and the bottom chassis are easily adhered to each other via the adhesive layer 601, assembly efficiency and productivity may be improved. The heat conduction member 600 may be applied to an entire rear surface of the bottom chassis 500, thereby preventing heat conduction from decreasing. The heat conduction member 600 is formed substantially in a "U" shape and comprises a first conducting part having first and second portions 610, 620 combined with lateral sides 521, 522 of the bottom chassis 500 and a second conducting part 630 combined with an external surface of a bottom side 510 of the bottom chassis 500. The heat conduction member 600 is preferably a continuous member that is combined with the external surfaces of the lateral sides 521, 522 and the bottom side 510 of the bottom chassis 500. Alternatively, the heat conduction member 600 may have discontinuous parts, to accommodate, for example, discontinuous parts, such as combining holes (not shown) formed on the bottom chassis 500.

Figure 3:
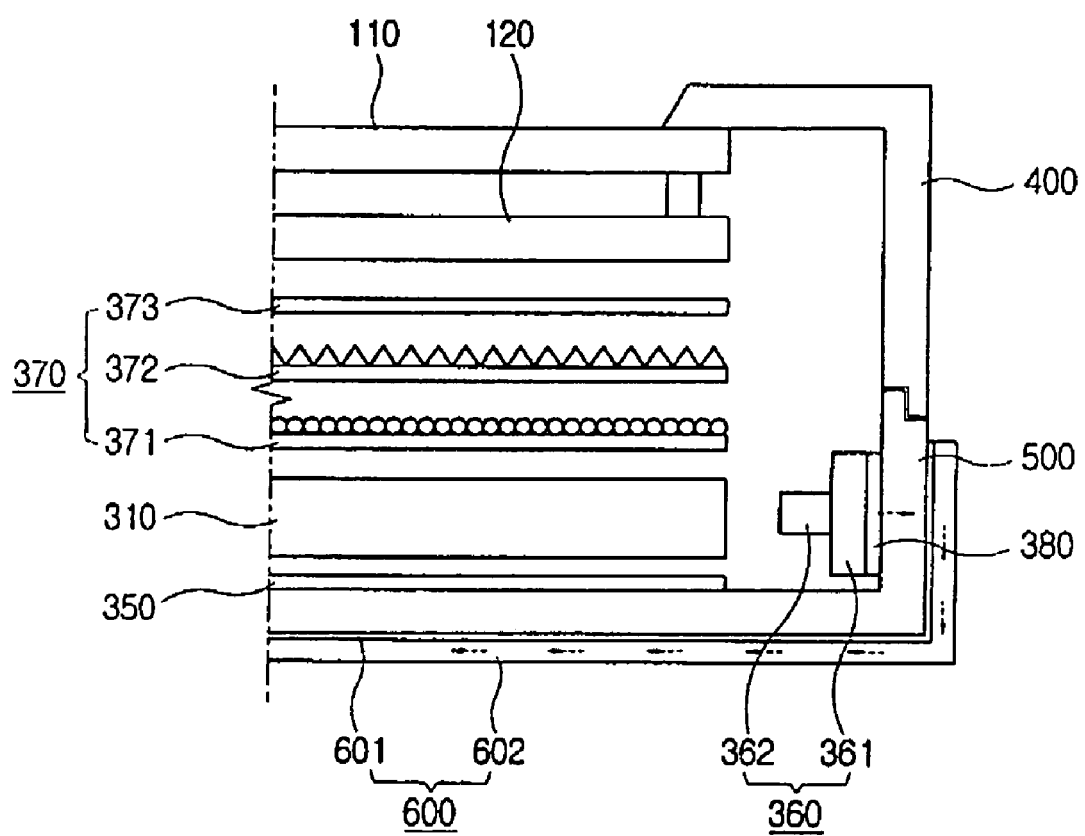
FIG. 3 is an enlarged view of a portion of FIG. 2 for illustrating how heat generated from an LED unit is radiated.
Figure 4:
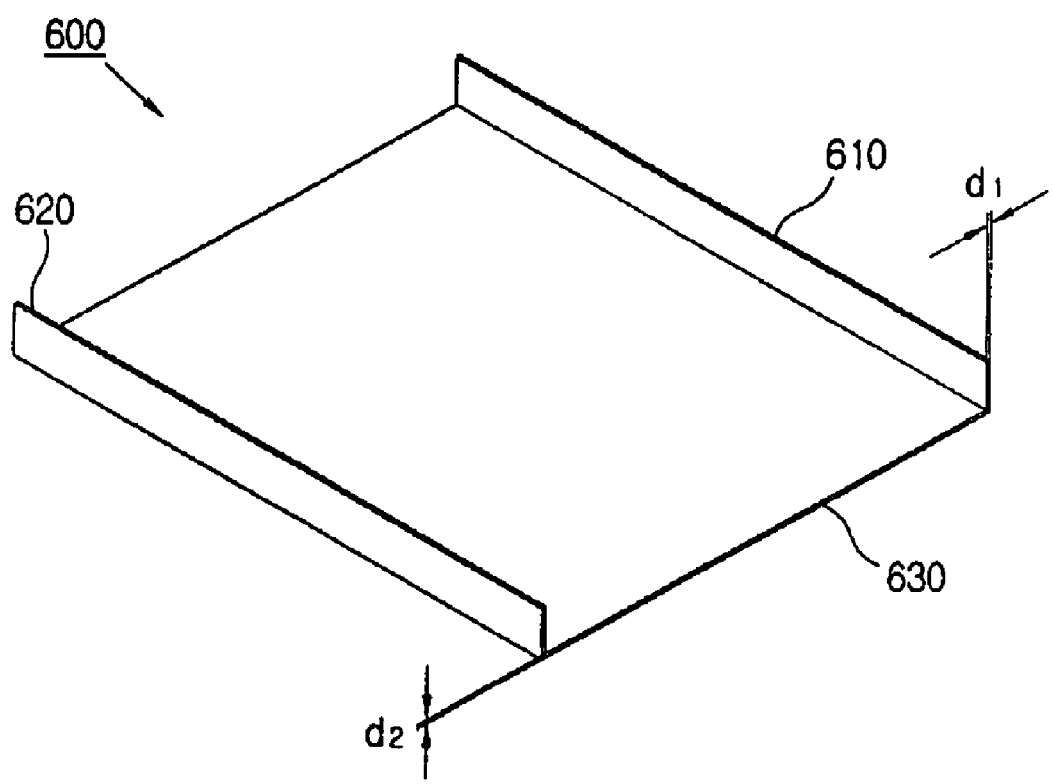
FIG. 4 is a perspective view of the heat conduction member shown in FIG. 1.

The first and second portions 610, 620 of the first conducting part are formed in a plate shape and correspond to the LED units 360. As shown in FIG. 3, heat generated from each LED unit 360 and passing through the bottom chassis 500 is conducted to the first and second portions 610, 620 of the first conducting part and to the second conducting part 630, then, is radiated to outside of the LCD 1. In this case, a thickness ($d_1$) of the first and second portions 610, 620 of the first conducting part close to the LED units 360 may be thicker than a thickness ($d_2$) of the second conducting part 630, thereby making heat conduction efficient. Also, manufacturing cost may be reduced by decreasing the thickness ($d_2$) of the second conducting part 630.

The second conducting part 630 is formed in a plate shape and combined with the external surface of the bottom side 510 of the bottom chassis 500.

The heat conduction member 600 is formed as a film type and is adhered in a "U" shape to the bottom chassis 500 by a manufacturer. Alternatively, the heat conduction member 600 can be made in a "U" shape by using a mold.

Figure 5:
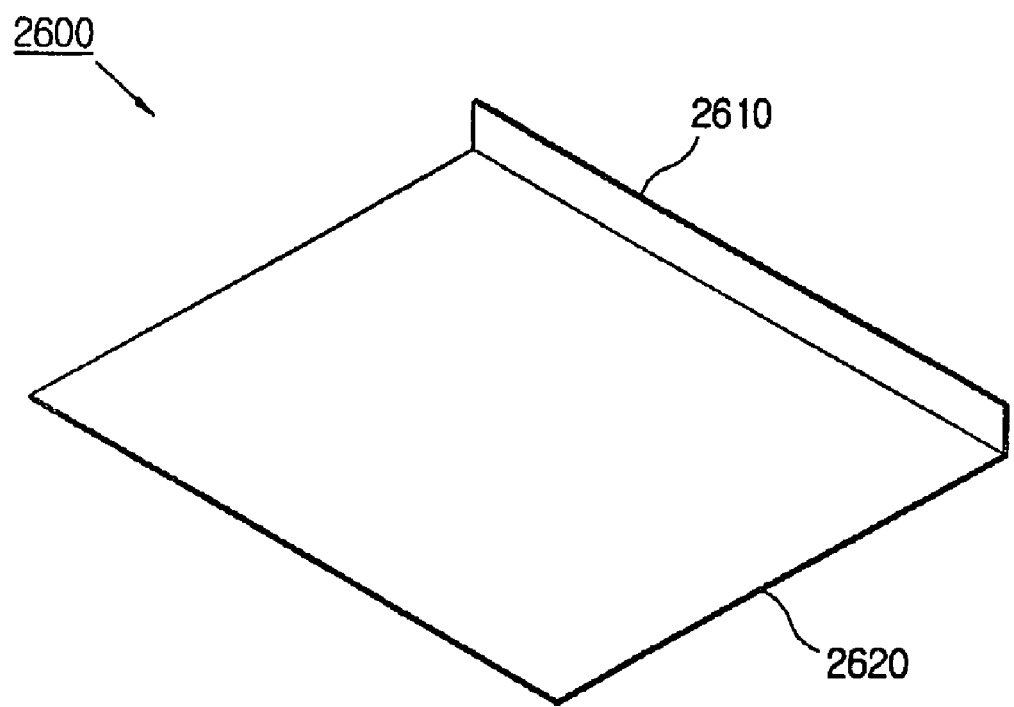
FIGS. 5 to 7 are perspective views of heat conduction members according to embodiments of the present invention.

Referring to FIG. 5, a thermal conduction member 2600 according to an embodiment is formed substantially in an "L" shape. The heat conduction member 2600 comprises a first conducting part 2610 combined with one of the lateral sides 521, 522 of the bottom chassis 500 and a second conducting part 2620 combined with the bottom side 510 of the bottom chassis 500. The heat conduction member 2600 may be useful when the LED unit 360 is disposed along one side of the light guiding plate 310.

Figure 6:
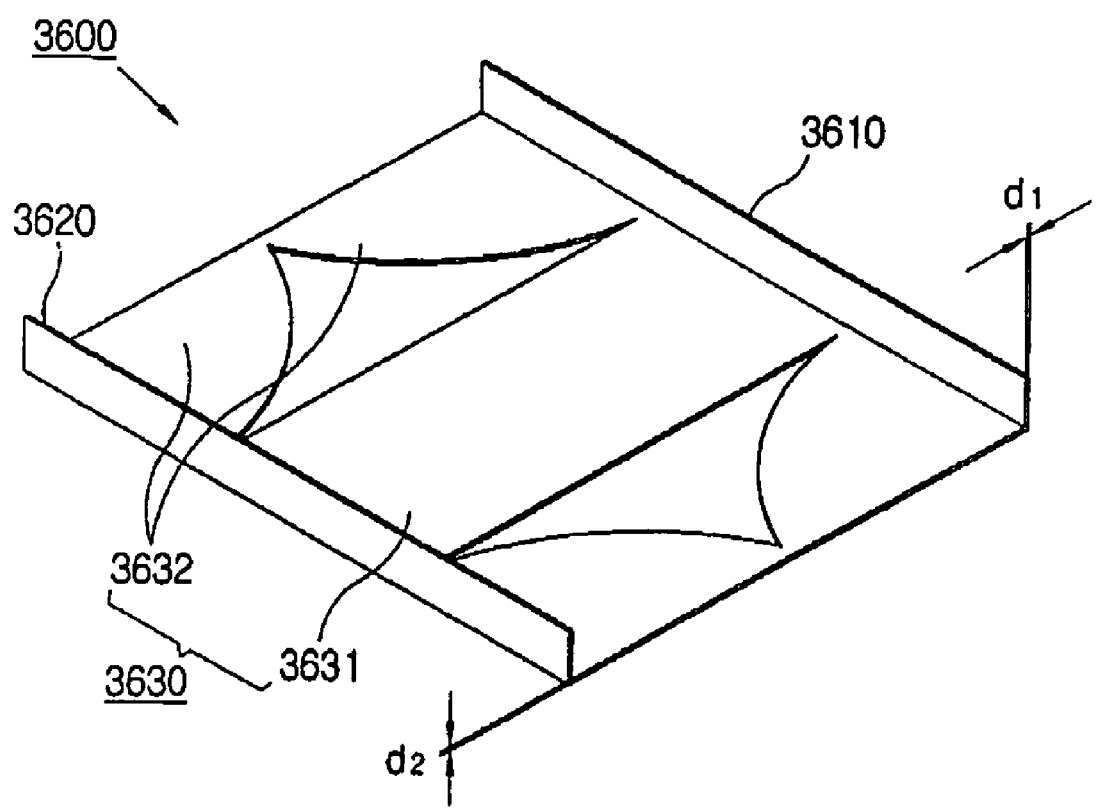

Referring to FIG. 6, a second conducting part 3630 of a heat conduction member 3600 according to an embodiment partly covers a rear surface of the bottom chassis 500, while the second conducting part 630 of the heat conduction member 600 is formed in a plate shape and covers the entire rear surface of the bottom chassis 500. Thus, a manufacturing cost according to the present embodiment may be reduced. The heat conduction member 3600 comprises a rectilinear area 3631 extended in the horizontal direction from the first and second portions 3610, 3620 of the first conducting part and oblique areas 3632 extended in the sideways direction from the first and second portions 3610, 3620. A thickness ($d_1$) of the first and second portions 3610, 3620 close to the LED units 360 may be thicker than a thickness ($d_2$) of the second conducting part 3630, thereby making heat conduction efficient. Also, manufacturing cost may be reduced by decreasing the thickness ($d_2$) of the second conducting part 3630.

The rectilinear area 3631 is disposed toward a center area of the bottom chassis 500 and the oblique areas 3632 are disposed toward edges of the bottom chassis 500 adjacent to a pair of LED units 360. Accordingly, heat inside of the LCD 1 transfers to the center area or the edges of the bottom chassis 500 and may be radiated to the outside of the LCD 1. The form of the second conducting part 3630 may be varied so long as heat conducted from the first and second portions 3610, 3620 of the first conducting part is efficiently radiated.

Figure 7:
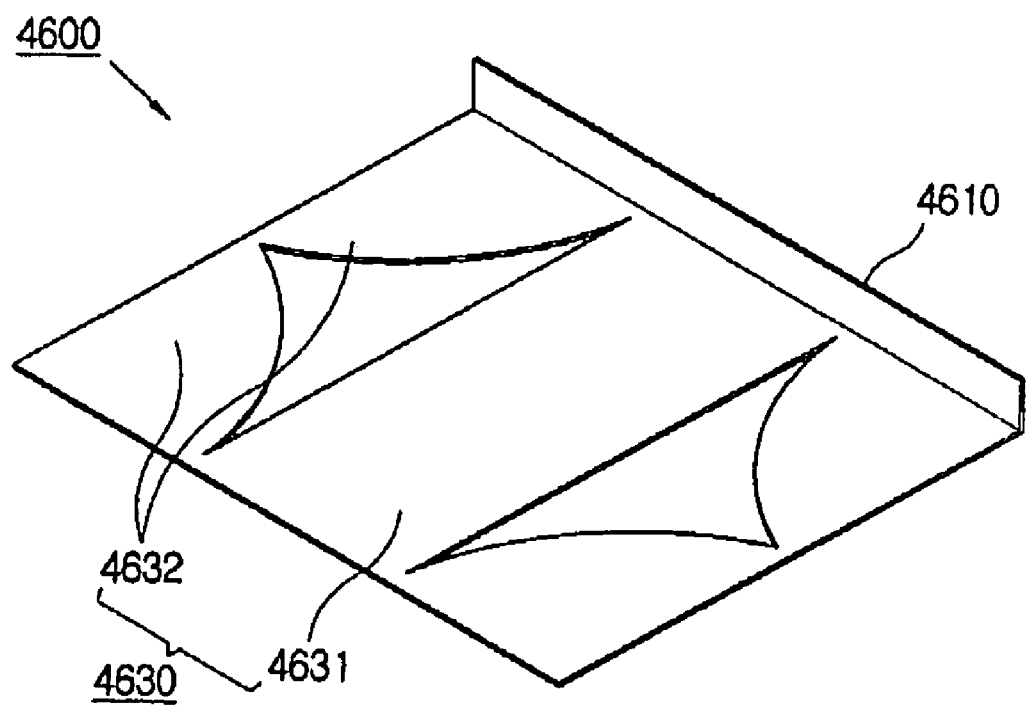

As shown in FIG. 7, a heat conduction member 4600 is formed substantially in an "L" shape. The heat conduction member 4600 according to an embodiment of the present invention comprises a first conducting part 4610 combined with one of the lateral sides of the bottom chassis 500 and a second conducting part 4630 combined with the bottom side 510 of the bottom chassis 500. The heat conduction member 4600 may be useful when the LED unit 360 is disposed along one side of the light guiding plate 310.

In aforementioned embodiments, the first and the second conducting parts are formed as a single body, but may be formed separately. Also, the first and the second conducting parts are made of the same substances. Alternatively, the first and second conducting parts may be made of different substances. In accordance with an embodiment of the present invention, thermal conductivity of the first conducting part facing the LED unit is preferably higher than that of the second conducting part.

Although the illustrative embodiments have been described herein with reference to the accompanying drawings, is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A liquid crystal display comprising:
 a panel on which an image is formed;
 a light guiding plate disposed behind the panel;
 a light emitting diode unit disposed along at least one side of the light guiding plate, the light emitting diode unit providing light to the panel;
 a chassis accommodating the light guiding plate and the light emitting diode unit; and
 a heat conduction member disposed across an external surface of the chassis from an area facing the light emitting diode unit to an area apart from the light emitting diode unit, the heat conduction member having a higher thermal conductivity than a thermal conductivity of the chassis.

2. The liquid crystal display according to claim 1, wherein the thermal conductivity of the heat conduction member is at least about 90 W/mK higher than the thermal conductivity of the chassis.

3. The liquid crystal display according to claim 2, wherein the thermal conductivity of the heat conduction member is greater than or equal to about 220 W/mK.

4. The liquid crystal display according to claim 3, wherein the thermal conductivity of the chassis is less than or equal to about 130 W/mK.

5. The liquid crystal display according to claim 1, wherein:
 the chassis is formed in a quadrangular shape and comprises a bottom side and lateral sides formed by upwardly bending each edge of the bottom side; and
 the heat conduction member comprises a first conducting part combined with at least one of the lateral sides and a second conducting part combined with the bottom side.

6. The liquid crystal display according to claim 5, wherein light emitting diode units are disposed at opposite edges of the light guiding plate, and the first conducting-part includes a first portion and a second portion respectively disposed corresponding to the light emitting diode units at the opposite edges.

7. The liquid crystal display according to claim 6, wherein the second conducting part comprises a rectilinear area and an oblique area disposed in an oblique direction from the rectilinear area.

8. The liquid crystal display according to claim 7, wherein the first conducting part is thicker than the second conducting part.

9. The liquid crystal display according to claim 8, wherein the heat conduction member is formed by using a mold.

10. The liquid crystal display according to claim 6, wherein the first conducting part is thicker than the second conducting part.

11. The liquid crystal display according to claim 1, wherein the heat conduction member is applied to an entire rear surface of the chassis.

12. The liquid crystal display according to claim 1, wherein the heat conduction member further comprises an adhesive layer disposed on the chassis.

13. The liquid crystal display according to claim 1, wherein the heat conduction member comprises graphite.

14. A heat conduction member for a liquid crystal display comprising:
 a first conducting part; and
 a second conducting part extending from the first conducting part, wherein the heat conduction member is disposed across an external surface of a chassis accommodating a backlight unit and thermal conductivity of the heat conduction member is greater than that of the chassis.

15. The heat conduction member according to claim 14, wherein the first conducting part and the second conducting part have a plate shape and are combined to form a single body having a 'U' shape.

16. The heat conduction member according to claim 15, wherein the first conducting part is thicker than the second conducting part.

17. A heat conduction member for a liquid crystal display comprising:

a first conducting part; and a second conducting part extending from the first conducting part, wherein the second conducting part comprises a rectilinear area and an oblique area disposed in an oblique direction from the rectilinear area.

18. The heat conduction member according to claim 17, wherein the first conducting part is thicker than the second conducting part.

19. The heat conduction member according to claim 14, wherein the heat conduction member comprises graphite.

* * * * *